US012580558B2

(12) United States Patent
Costa et al.

(10) Patent No.: US 12,580,558 B2
(45) Date of Patent: Mar. 17, 2026

(54) DEVICE, HALF BRIDGE AND METHOD FOR OPERATING A DEVICE

(71) Applicant: Robert Bosch GmbH, Stuttgart (DE)

(72) Inventors: Marco Salvatore Costa, Weil im Schoenbuch (DE); Dominik Alexander Ruoff, St. Johann (DE); Manuel Wild, Stuttgart (DE); Daniel Schweiker, Ludwigsburg (DE); Josef Goeppert, Kusterdingen (DE); Matthias Boesing, Ludwigsburg (DE); Philipp Eggers, Delligsen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 18/720,845

(22) PCT Filed: Dec. 14, 2022

(86) PCT No.: PCT/EP2022/085804
§ 371 (c)(1),
(2) Date: Jul. 12, 2024

(87) PCT Pub. No.: WO2023/110991
PCT Pub. Date: Jun. 22, 2023

(65) Prior Publication Data
US 2025/0062761 A1 Feb. 20, 2025

(30) Foreign Application Priority Data
Dec. 16, 2021 (DE) ..................... 10 2021 214 521.3

(51) Int. Cl.
*H03K 17/12* (2006.01)
(52) U.S. Cl.
CPC .................................. *H03K 17/122* (2013.01)

(58) Field of Classification Search
None
See application file for complete search history.

(56) References Cited

U.S. PATENT DOCUMENTS

| | | | | |
|---|---|---|---|---|
| 5,949,273 A | * | 9/1999 | Mourick | H03K 17/12 327/434 |
| 6,515,531 B2 | * | 2/2003 | Ruff | H03K 17/12 327/434 |

(Continued)

FOREIGN PATENT DOCUMENTS

| | | |
|---|---|---|
| DE | 102012207155 A1 | 10/2013 |
| DE | 102018123828 A1 | 3/2020 |

(Continued)

OTHER PUBLICATIONS

International Search Report for PCT/EP2022/085804, Issued Mar. 9, 2023.

*Primary Examiner* — Jeffrey S Zweizig
(74) *Attorney, Agent, or Firm* — NORTON ROSE FULBRIGHT US LLP

(57) ABSTRACT

A device including a gate driver stage, a decoupling circuit, and a semiconductor switch. The semiconductor switch has at least a first semiconductor transistor and a second semiconductor transistor. The first semiconductor transistor and the second semiconductor transistor are connected in parallel to one another. The decoupling circuit is electrically connected on the input side to an output of the gate driver stage and on the output side to the semiconductor switch. The decoupling circuit has a first decoupling path and a second decoupling path. The first decoupling path is electrically connected to a first gate terminal of the first semiconductor transistor and the second decoupling path is electrically connected to a second gate terminal of the second semiconductor transistor. The first decoupling path (Continued)

and the second decoupling path are connected in parallel to one another, and are constructed identically.

6 Claims, 3 Drawing Sheets

(56) References Cited

U.S. PATENT DOCUMENTS

| | | | | |
|---|---|---|---|---|
| 8,698,549 | B2 * | 4/2014 | Souma | H01H 37/761 |
| | | | | 327/525 |
| 8,848,322 | B2 * | 9/2014 | Hafner | H02H 9/02 |
| | | | | 361/87 |
| 10,263,506 | B2 * | 4/2019 | Brueckner | H03K 17/08104 |
| 10,630,068 | B2 * | 4/2020 | Yuan | H02H 7/1255 |
| 10,651,839 | B2 * | 5/2020 | Morisaki | H03K 17/0822 |
| 2017/0373685 | A1 | 12/2017 | Meiser et al. | |

FOREIGN PATENT DOCUMENTS

| | | | |
|---|---|---|---|
| DE | 11201600360 | B4 | 7/2020 |
| DE | 112016003609 | B4 | 7/2020 |
| DE | 112015002272 | B4 | 7/2024 |
| EP | 3065297 | A1 | 9/2016 |
| EP | 3226367 | A1 | 10/2017 |

* cited by examiner

500 start detect short circuit of
first semiconductor
transistor — 510 switch on second
semiconductor
transistor — 520 charge capacitor of
first decoupling
path — 530 use gate driver stage
to generate a current — 540 stop

DEVICE, HALF BRIDGE AND METHOD FOR OPERATING A DEVICE

FIELD

The present invention relates to a device, to a half bridge, and to a method for operating the device.

BACKGROUND INFORMATION

When operating parallel-connected semiconductor transistors, for example within a module, a drain-gate short circuit and/or gate-source short circuit occurs in one of the semiconductor transistors in the event of a fault. Due to the short circuit of the faulty semiconductor transistor, a voltage migrates via the gate path of the faulty semiconductor transistor, which can still form a channel, to the parallel-connected functional semiconductor transistors. These parallel-connected semiconductor transistors are transferred into an intermediate state, wherein they run the risk of thermal runaway.

In order to prevent this, parallel circuits of a plurality of MOSFETs are conventionally used, which are each directly connected to a gate driver and can be switched on and off thereby.

The disadvantage here is that, if the gate drivers are directly connected to the gates of the MOSFETs, the entire assembly is destroyed in the event of a fault of a single MOSFET and is thus no longer functional.

An object of the present invention is to overcome this disadvantage.

SUMMARY

According to an example embodiment of the present invention, the device comprises a gate driver stage, a decoupling circuit, and a semiconductor switch, wherein the semiconductor switch has at least a first semiconductor transistor and a second semiconductor transistor, wherein the first semiconductor transistor and the second semiconductor transistor are connected in parallel to one another. According to an example embodiment of the present invention, the decoupling circuit is electrically connected on the input side to an output of the gate driver stage and on the output side to the semiconductor switch, wherein the decoupling circuit has a first decoupling path and a second decoupling path, wherein the first decoupling path is electrically connected to a first gate terminal of the first semiconductor transistor and the second decoupling path is electrically connected to a second gate terminal of the second semiconductor transistor, and the first decoupling path and the second decoupling path are connected in parallel to one another, and the first decoupling path and the second decoupling path are constructed identically. In the event of a fault, the decoupling circuit of the first semiconductor transistor or of the second semiconductor transistor ensures the functionality of the semiconductor switch. The term "event of a fault" refers to the fact that there is a short circuit of a gate-source terminal and/or of the gate-drain terminal of the first semiconductor switch.

An advantage here is that the gate driver stage or the gate driver can continue to control the fault-free semiconductor transistors. This avoids the transfer of the fault-free semiconductor transistors into an intermediate state. Furthermore, it is advantageous that the faulty semiconductor transistor is identified quickly.

In one example embodiment of the present invention, the first decoupling path and the second decoupling path each comprise a first resistor, a second resistor, and a first capacitor, wherein the first resistor is greater than the second resistor and the first resistor and the first capacitor form a first parallel circuit, wherein the first parallel circuit and the second resistor form a first series circuit.

An advantage here is that the transient signals generated by the faulty semiconductor transistor control the functional semiconductor transistors through good coupling, wherein the fault currents in the gate driver stage are low. Furthermore, the switching behavior of the fault-free semiconductor switches is improved since the time constant is reduced.

In a further configuration of the present invention, the first decoupling path and the second decoupling path each have a first diode, a second capacitor, and a third resistor, wherein a cathode of the first diode is electrically connected to the output of the gate driver stage and an anode of the first diode is electrically connected to the semiconductor switch, wherein the first diode and the second capacitor form a second parallel circuit and the second parallel circuit and the third resistor form a second series circuit.

An advantage here is that, depending on the direction of the current, a decoupling between the gate driver stage and the semiconductor switch or a bridging of the capacitance takes place.

In a further configuration of the present invention, the first decoupling path and the second decoupling path each have a second diode, a fourth resistor, a third diode, a fifth resistor, a third capacitor, and a sixth resistor, wherein an anode of the second diode is electrically connected to the output of the gate driver stage and a cathode of the second diode is electrically connected to the semiconductor switch, wherein a cathode of the third diode is electrically connected to the output of the gate driver stage and an anode of the third diode is electrically connected to the semiconductor switch, wherein the second diode and the fourth resistor form a third series circuit, wherein the third capacitor and the sixth resistor form a fourth series circuit, wherein the fourth series circuit and the fifth resistor form a third parallel circuit, wherein the third parallel circuit and the third diode form a fifth series circuit, wherein the third series circuit and the fifth series circuit form a fourth parallel circuit.

In a further configuration of the present invention, the semiconductor switch comprises MOSFETs or IGBTs.

In a development of the present invention, a half bridge comprises two devices according to the present invention, wherein one of the devices has a first semiconductor switch, which functions as a low-side switch, and the other device has a second semiconductor switch, which functions as a high-side switch.

An advantage here is that the remaining availability of the half bridge is ensured. This means that the voltage drop caused by the short circuit at the gate of the faulty semiconductor transistor cannot migrate to the parallel, still intact switch.

A method according to an example embodiment of the present invention for operating a device comprising a gate driver stage, a decoupling circuit, and a semiconductor switch, wherein the decoupling circuit has a first decoupling path and a second decoupling path, wherein the first decoupling path and the second decoupling path are connected in parallel to one another, and the semiconductor switch has at least a first semiconductor transistor and a second semiconductor transistor, wherein the first semiconductor transistor and the second semiconductor transistor are connected in parallel to one another, comprises detecting a short circuit of the first semiconductor transistor by means of a gate driver control device, controlling the second semiconductor transistor by means of the gate driver stage so that the second semiconductor transistor is switched on. Furthermore, the method comprises charging a first capacitor of the first decoupling path by means of the gate driver stage or a transient, and generating a current by means of the gate driver stage so that the functionality of the second semiconductor transistor is ensured via the second decoupling path.

Further advantages can be found in the following description of exemplary embodiments of the present invention and the rest of the disclosure herein.

BRIEF DESCRIPTION OF THE DRAWINGS

The present invention is explained below with reference to preferred embodiments and the figures.

DETAILED DESCRIPTION OF EXAMPLE EMBODIMENTS

Figure 1:
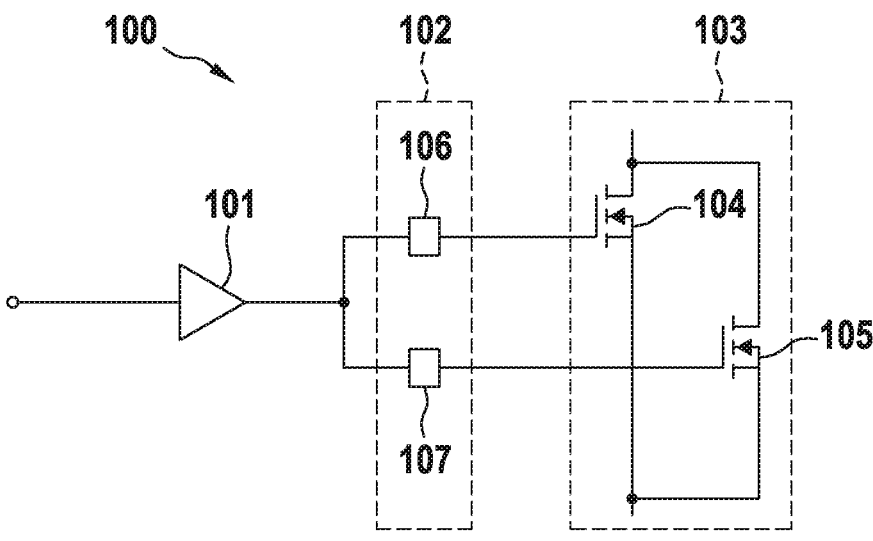
FIG. 1 shows a device comprising a gate driver stage, a decoupling circuit, and a semiconductor switch.

FIG. 1 shows a device 100 comprising a gate driver stage 101, a decoupling circuit 102, and a semiconductor switch 103. The decoupling circuit 102 is arranged between an output of the gate driver stage 101 and the semiconductor switch 103 and is electrically connected thereto. The semiconductor switch 103 comprises at least a first semiconductor transistor 104 and a second semiconductor transistor 105, wherein the first semiconductor transistor 104 and the second semiconductor transistor 105 are arranged or connected in parallel to one another. The decoupling circuit 102 has a first decoupling path 106 and a second decoupling path 107, wherein the first decoupling path 106 is electrically connected to a first gate terminal of the first semiconductor transistor 104 and the second decoupling path 107 is electrically connected to a second gate terminal of the second semiconductor transistor 105. The first decoupling path 106 and the second decoupling path 107 are connected or arranged in parallel to one another, wherein the first decoupling path 106 and the second decoupling path 107 are constructed identically. In the event of a fault, the decoupling circuit 102 of the first semiconductor transistor 104 or of the second semiconductor transistor 105 ensures the functionality of the semiconductor switch 103.

In one exemplary embodiment of the present invention, the semiconductor switch 103 comprises a plurality of semiconductor transistors connected in parallel to one another. A decoupling circuit is arranged between the output of the gate driver stage 101 and each semiconductor transistor.

Figure 2:
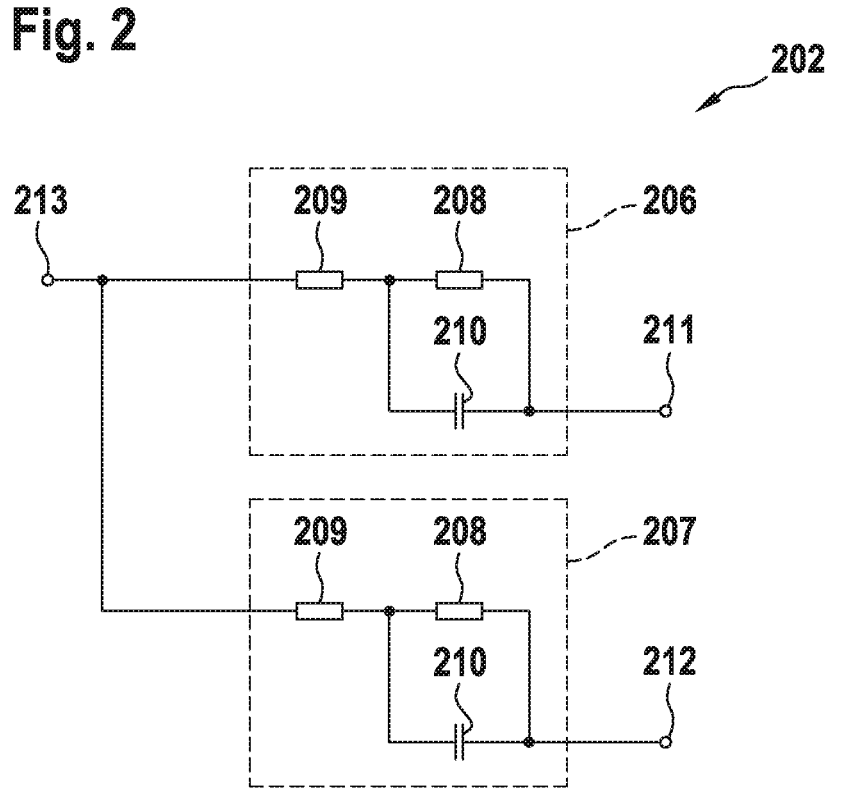
FIG. 2 shows a first exemplary embodiment of the decoupling circuit, according to the present invention.

FIG. 2 shows a first exemplary embodiment of the decoupling circuit 202 of the present invention. The decoupling circuit 202 comprises a first decoupling path 206 and a second decoupling path 207, which are constructed identically. The first decoupling path 206 and the second decoupling path 207 are connected in parallel to one another, wherein the first decoupling path 206 and the second decoupling path 207 are electrically connected on the input side to an output 213 of the gate driver stage. On the output side, the first decoupling path 206 is electrically connected to the first semiconductor transistor via a first terminal 211 and the second decoupling path 207 is electrically connected to the second semiconductor transistor via a second terminal 212. The first decoupling path 206 and the second decoupling path 207 comprise a first resistor 208, a second resistor 209, and a first capacitor 210. The first resistor 208 is greater than the second resistor 209. The first resistor 208 and the first capacitor 210 form a first parallel circuit arranged in series with the second resistor.

Figures 3, 4:
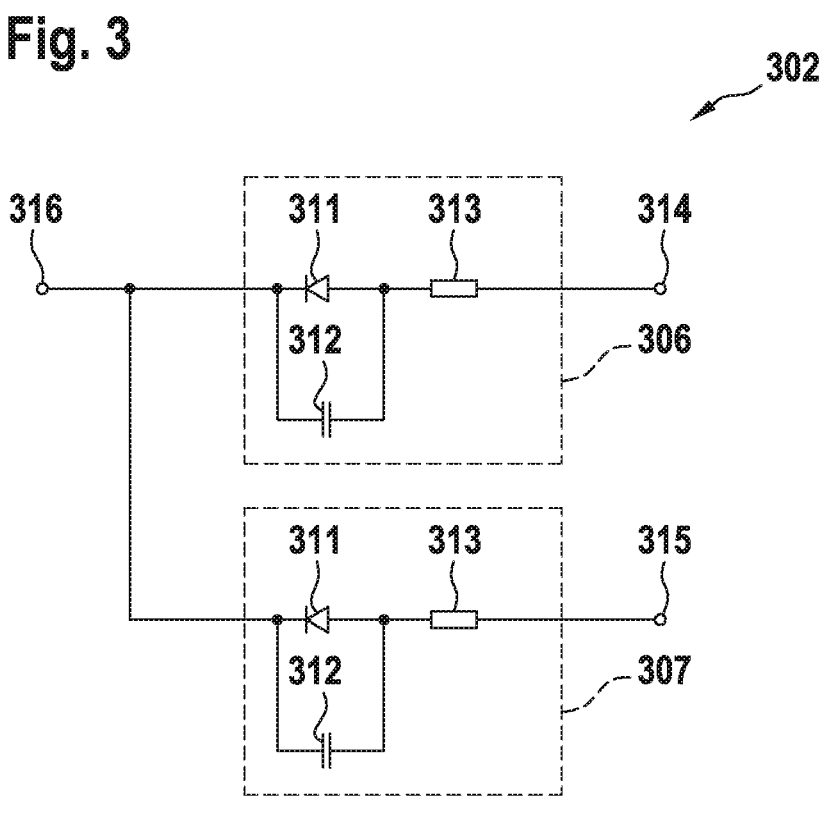
FIG. 3 shows a second exemplary embodiment of the decoupling circuit, according to the present invention.
FIG. 4 shows a third exemplary embodiment of the decoupling circuit, according to the present invention.

FIG. 3 shows a second exemplary embodiment of the decoupling circuit 302. The decoupling circuit 302 comprises a first decoupling path 306 and a second decoupling path 307, which are arranged in parallel to one another. The first decoupling path 306 and the second decoupling path 307 are electrically connected on the input side to an output 316 of the gate driver stage. On the output side, the first decoupling path 306 is electrically connected to the first semiconductor transistor via a first terminal 314 and the second decoupling path 307 is electrically connected to the second semiconductor transistor via a second terminal 315. The first decoupling path 306 and the second decoupling path 307 each comprise a first diode 311, a second capacitor 312, and a third resistor 313. The first diode 311 is an npn diode, by way of example. A cathode of the first diode 311 is electrically connected to the output of the gate driver stage and an anode of the first diode 311 is electrically connected to the semiconductor switch. The first diode 311 and the second capacitor 312 form a second parallel circuit and the second parallel circuit and the third resistor 313 form a second series circuit. In normal operation, when the semiconductor switch is switched on, the first diode 311 is bridged via the second capacitor 312. In the event of a fault of a semiconductor transistor of the semiconductor switch, a transient current flows from the faulty semiconductor transistor via the third resistor 313 and the first diode 311, which is now polarized in the forward direction. Since a current flows from the gate driver stage toward the semiconductor switch, the remaining semiconductor transistors or the semiconductor switch are kept functional.

FIG. 4 shows a third exemplary embodiment of the decoupling circuit 402. The decoupling circuit 402 comprises a first decoupling path 406 and a second decoupling path 407, which are arranged in parallel to one another. The first decoupling path 406 and the second decoupling path 407 are electrically connected on the input side to an output 422 of the gate driver stage. On the output side, the first decoupling path 406 is electrically connected to the first semiconductor transistor via a first terminal 420 and the second decoupling path 407 is electrically connected to the second semiconductor transistor via a second terminal 421. The first decoupling path 406 and the second decoupling path 407 each comprise a second diode 414, a fourth resistor 415, a third diode 416, a fifth resistor 417, a third capacitor 418, and a sixth resistor 419. The second diode 414 and the third diode 416 are designed as npn diodes, by way of example. An anode of the second diode 414 is electrically connected to the output of the gate driver stage and a cathode of the second diode is electrically connected to the semiconductor switch. A cathode of the third diode 414 is electrically connected to the output of the gate driver stage and an anode of the third diode 414 is electrically connected to the semiconductor switch. When a current flows from the output of the gate driver stage to the semiconductor switch, the second diode 414 is thus polarized in the forward direction and the third diode 416 is polarized in the reverse direction. The second diode 414 and the fourth resistor 415 form a third series circuit, wherein the third capacitor 418 and the sixth resistor 419 form a fourth series circuit, wherein the fourth series circuit and the fifth resistor 417 form a third parallel circuit. The third parallel circuit and the third diode 416 form a fifth series circuit, wherein the third series circuit and the fifth series circuit form a fourth parallel circuit. In normal operation, when the semiconductor switch is switched on, the current flows from the output of the gate driver stage via the second diode 414, which is polarized in the forward direction, and the fourth resistor 415. In the event of a fault of a semiconductor transistor of the semiconductor switch, a transient current flows from the faulty semiconductor transistor via the fifth series circuit.

The first capacitor 210, the second capacitor 312, and the third capacitor 418 each have a higher capacitance than an internal gate capacitance of the semiconductor transistors connected to the output of the respective decoupling paths.

FIGS. 2, 3 and 4 show two decoupling paths, by way of example. However, the present invention is not limited to the number of two decoupling paths. The decoupling circuit 202, 302, and 402 may have a plurality of decoupling paths arranged in parallel to one another, wherein each decoupling path is electrically connected on the output side to a semiconductor transistor. On the input side, the decoupling circuit 202, 302 and 402 is connected to the output of the gate driver stage.

The device 100 and the half bridge are used, for example, in inverters and converters of an electric vehicle drive.

Figure 5:
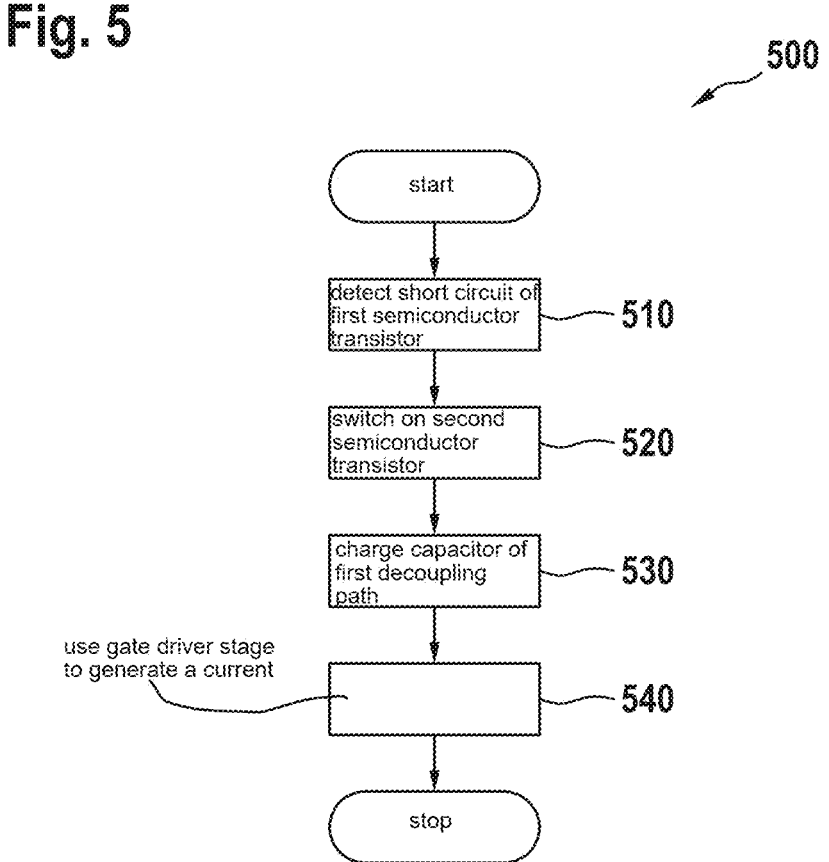
FIG. 5 shows a method for operating a device comprising a gate driver stage, a decoupling circuit, and a semiconductor switch, according to an example embodiment of the present invention.

FIG. 5 shows the method 500 according to the present invention for operating a device comprising a gate driver stage, a decoupling circuit, and a semiconductor switch, wherein the decoupling circuit has a first decoupling path and a second decoupling path, wherein the first decoupling path and the second decoupling path are connected in parallel to one another, and the semiconductor switch has at least a first semiconductor transistor and a second semiconductor transistor, wherein the first semiconductor transistor and the second semiconductor transistor are connected in parallel to one another. The method 500 starts with a step 510, in which a short circuit of the first semiconductor transistor is detected by means of a gate driver control device. In a subsequent step 520, the second semiconductor transistor is switched on by means of the gate driver stage. The intact second semiconductor transistor is activated when the half bridge path current becomes zero. In a subsequent step 530, a capacitor of the first decoupling path is charged by means of the gate driver stage or a transient. In a subsequent step 540, the gate driver stage is used to generate a current that ensures the functionality of the second semiconductor transistor via the second decoupling path. Alternatively, steps 510 and 520 may be swapped.

In the method 500, four cases must be distinguished. In the first case, the direction of the current is from the output of the gate driver stage toward the defective gate of the first semiconductor transistor. The gate driver stage switches on the already short-circuited first semiconductor transistor and clamps the input of the decoupling circuit to the supply voltage. In the process, the second semiconductor transistor is also switched on. The gate driver stage now charges the capacitance of the decoupling network of the defective first semiconductor transistor and the capacitance of the parallel intact second semiconductor transistor or the capacitances of the parallel-connected intact semiconductor transistors. The gate driver stage subsequently supplies the current via the high-resistance resistor of the decoupling network so that the intact semiconductor transistors remain switched on.

In the second case, the direction of the current is from the output of the gate driver stage toward the defective gate of the first semiconductor transistor. The gate driver stage has switched on the second semiconductor transistor and clamps the supply voltage to the input of the decoupling circuit. As a result, the short circuit or defect in the first semiconductor transistor occurs. The gate driver stage briefly recharges the capacitance of the decoupling network so that the gate driver stage subsequently only provides the current via the high-resistance resistor of the decoupling network so that the second semiconductor transistor remains switched on.

In the third case, the direction of the current is from the defective gate of the first semiconductor transistor toward the gate driver stage. In this case, the gate driver stage pulls the input of the decoupling circuit to ground. Subsequently, the defect of the first semiconductor transistor occurs. The gate driver stage must be able to briefly clamp the current coming from the decoupling network, until the capacitance in the decoupling network of the defective chip is charged. Afterwards, the driver only has to continue to clamp the minimal current, resulting from the high-resistance resistor, to ground.

In the fourth case, the gate driver stage actively switches off the semiconductor transistors and connects the input of the decoupling network to ground. The gate driver stage subsequently discharges the capacitance of the intact parallel semiconductor transistor.

The invention claimed is:

1. A device, comprising:
   a gate driver stage;
   a decoupling circuit; and
   a semiconductor switch including at least a first semiconductor transistor and a second semiconductor transistor, wherein the first semiconductor transistor and the second semiconductor transistor are connected in parallel to one another;
   wherein the decoupling circuit is electrically connected on an input side of the decoupling circuit to an output of the gate driver stage and on an output side of the docoupling circuit to the semiconductor switch, wherein the decoupling circuit has a first decoupling path and a second decoupling path, wherein the first decoupling path is electrically connected to a first gate terminal of the first semiconductor transistor and the second decoupling path is electrically connected to a second gate terminal of the second semiconductor transistor, and the first decoupling path and the second decoupling path are connected in parallel to one another, and the first decoupling path and the second decoupling path are constructed identically, and wherein, in the event of a fault of the first semiconductor transistor or of the second semiconductor transistor, the decoupling circuit ensures functionality of the semiconductor switch;
   wherein the first decoupling path and the second decoupling path each have a first diode, a second capacitor, and a third resistor, wherein a cathode of the first diode is electrically connected to the output of the gate driver stage and an anode of the first diode is electrically connected to the semiconductor switch, wherein the first diode and the second capacitor form a second parallel circuit and the second parallel circuit and the third resistor form a second series circuit.

2. The device according to claim 1, wherein the semiconductor switch includes MOSFETs or IGBTs.

3. A device, comprising:

a gate driver stage;

a decoupling circuit; and a semiconductor switch including at least a first semiconductor transistor and a second semiconductor transistor, wherein the first semiconductor transistor and the second semiconductor transistor are connected in parallel to one another;

wherein the decoupling circuit is electrically connected on an input side of the decoupling circuit to an output of the gate driver stage and on an output side of the docoupling circuit to the semiconductor switch, wherein the decoupling circuit has a first decoupling path and a second decoupling path, wherein the first decoupling path is electrically connected to a first gate terminal of the first semiconductor transistor and the second decoupling path is electrically connected to a second gate terminal of the second semiconductor transistor, and the first decoupling path and the second decoupling path are connected in parallel to one another, and the first decoupling path and the second decoupling path are constructed identically, and wherein, in the event of a fault of the first semiconductor transistor or of the second semiconductor transistor, the decoupling circuit ensures functionality of the semiconductor switch;

wherein the first decoupling path and the second decoupling path each have a second diode, a fourth resistor, a third diode, a fifth resistor, a third capacitor, and a sixth resistor, wherein an anode of the second diode is electrically connected to the output of the gate driver stage and a cathode of the second diode is electrically connected to the semiconductor switch, wherein a cathode of the third diode is electrically connected to the output of the gate driver stage and an anode of the third diode is electrically connected to the semiconductor switch, wherein the second diode and the fourth resistor form a third series circuit, wherein the third capacitor and the sixth resistor form a fourth series circuit, wherein the fourth series circuit and the fifth resistor form a third parallel circuit, wherein the third parallel circuit and the third diode form a fifth series circuit, wherein the third series circuit and the fifth series circuit form a fourth parallel circuit.

4. The device according to claim 3, wherein the semiconductor switch includes MOSFETs or IGBTs.

5. A half bridge, comprising:

two devices, each of the two devices including:

a gate driver stage, a decoupling circuit, and a semiconductor switch including at least a first semiconductor transistor and a second semiconductor transistor, wherein the first semiconductor transistor and the second semiconductor transistor are connected in parallel to one another, wherein the decoupling circuit is electrically connected on an input side of the decoupling circuit to an output of the gate driver stage and on an output side of the docoupling circuit to the semiconductor switch, wherein the decoupling circuit has a first decoupling path and a second decoupling path, wherein the first decoupling path is electrically connected to a first gate terminal of the first semiconductor transistor and the second decoupling path is electrically connected to a second gate terminal of the second semiconductor transistor, and the first decoupling path and the second decoupling path are connected in parallel to one another, and the first decoupling path and the second decoupling path are constructed identically, and wherein, in the event of a fault of the first semiconductor transistor or of the second semiconductor transistor, the decoupling circuit ensures functionality of the semiconductor switch, wherein the first decoupling path and the second decoupling path each have a first diode, a second capacitor, and a third resistor, wherein a cathode of the first diode is electrically connected to the output of the gate driver stage and an anode of the first diode is electrically connected to the semiconductor switch, wherein the first diode and the second capacitor form a second parallel circuit and the second parallel circuit and the third resistor form a second series circuit;

wherein the semiconductor switch of one of the devices functions as a low-side switch, and the semiconductor switch of the other of the devices functions as a high-side switch.

6. A half bridge, comprising:

two devices, each of the two devices including:

a gate driver stage, a decoupling circuit, and a semiconductor switch including at least a first semiconductor transistor and a second semiconductor transistor, wherein the first semiconductor transistor and the second semiconductor transistor are connected in parallel to one another, wherein the decoupling circuit is electrically connected on an input side of the decoupling circuit to an output of the gate driver stage and on an output side of the docoupling circuit to the semiconductor switch, wherein the decoupling circuit has a first decoupling path and a second decoupling path, wherein the first decoupling path is electrically connected to a first gate terminal of the first semiconductor transistor and the second decoupling path is electrically connected to a second gate terminal of the second semiconductor transistor, and the first decoupling path and the second decoupling path are connected in parallel to one another, and the first decoupling path and the second decoupling path are constructed identically, and wherein, in the event of a fault of the first semiconductor transistor or of the second semiconductor transistor, the decoupling circuit ensures functionality of the semiconductor switch, wherein the first decoupling path and the second decoupling path each have a second diode, a fourth resistor, a third diode, a fifth resistor, a third capacitor, and a sixth resistor, wherein an anode of the second diode is electrically connected to the output of the gate driver stage and a cathode of the second diode is electrically connected to the semiconductor switch, wherein a cathode of the third diode is electrically connected to the output of the gate driver stage and an anode of the third diode is electrically connected to the semiconductor switch, wherein the second diode and the fourth resistor form a third series circuit, wherein the third capacitor and the sixth resistor form a fourth series circuit, wherein the fourth series circuit and the fifth resistor form a third parallel circuit, wherein the third parallel circuit and the third diode form a fifth series circuit, wherein the third series circuit and the fifth series circuit form a fourth parallel circuit;

wherein the semiconductor switch of one of the devices functions as a low-side switch, and the semiconductor switch of the other of the devices functions as a high-side switch.

* * * * *